Figure 1:
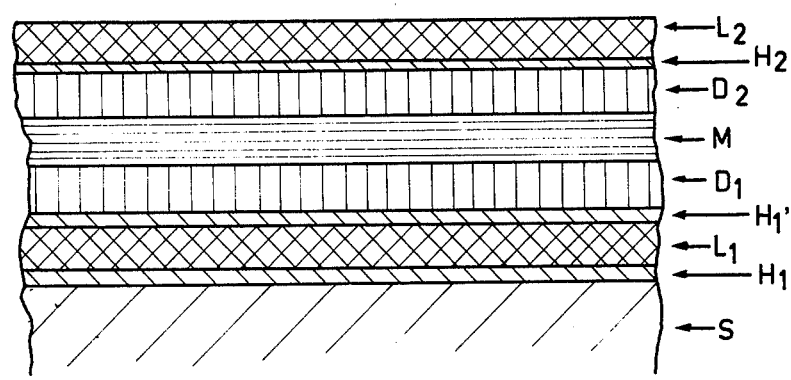

United States Patent [19]

Convertini et al.

[11] 4,267,510
[45] May 12, 1981

[54] INTEGRATED THIN LAYER MAGNETIC FIELD SENSOR

[75] Inventors: Ursula Convertini, Borstel; Heinz Dimingen, Hamburg; Holger Lüthje, Halstenbek; Friedrich Küch; Peter Tummoscheit, both of Bremen, all of Fed. Rep. of Germany

[73] Assignee: U.S. Philips Corporation, New York, N.Y.

[21] Appl. No.: 924,497

[22] Filed: Jul. 14, 1978

[51] Int. Cl.$^3$ .................................. G01R 33/02
[52] U.S. Cl. .................................................. 324/249
[58] Field of Search ............... 324/249; 365/171, 172; 427/96, 116; 29/602; 336/200

[56] References Cited

U.S. PATENT DOCUMENTS

| | | | |
|---|---|---|---|
| 3,185,947 | 5/1965 | Freymodsson | 29/602 |
| 3,290,758 | 12/1966 | Moyer | 29/602 |
| 3,375,503 | 3/1968 | Bertelsen | 365/171 |
| 3,867,690 | 2/1975 | Oshima et al. | 324/249 |
| 4,022,930 | 5/1977 | Fraser | 427/96 |

FOREIGN PATENT DOCUMENTS 2605414  5/1977  Fed. Rep. of Germany ........... 324/249

Primary Examiner—Gerard R. Strecker
Assistant Examiner—Walter E. Snow
Attorney, Agent, or Firm—William J. Streeter; Bernard Franzblau

[57] ABSTRACT

A thin-layer magnetic field sensor in which a thin magnetic layer which is magnetized in a preferred direction is surrounded by a magnetic HF measuring coil with variable inductance and in which an external magnetic field and the coil axis are aligned so as to be parallel to one of the preferred directions. The sensor comprises a sequence of geometrically structured layers arranged on a substrate, i.e. a structurized metal electrically conducting layer, a dielectric layer, a magnetic layer magnetized in a preferred direction, a further dielectric layer and a further structurized metal electrically conducting layer which forms with the first electrically conducting layer a coil which surrounds the magnetic layer.

14 Claims, 5 Drawing Figures

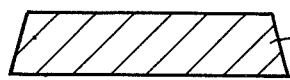 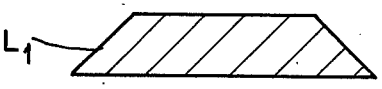
Fig.3a  Fig.3b
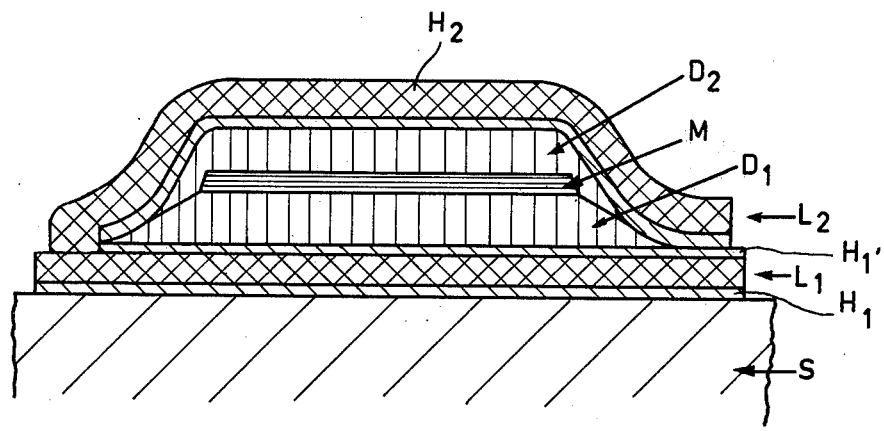
Fig.4

INTEGRATED THIN LAYER MAGNETIC FIELD SENSOR

The invention relates to a thin-layer magnetic field sensor, having a thin magnetic layer which is magnetized in a preferred direction and is surrounded by a magnetic HF measuring coil with variable inductance, and wherein an external magnetic field and the coil axis are aligned so as to be parallel to one of the preferred directions of magnetization.

U.S. Pat. No. 3,443,213 describes a thin-film magnetic field sensor, the measuring coil axis being disposed parallel to the direction of the "hard" axis and a magnetic bias field being oriented in accordance with the "easy" axis, the fields to be measured also being oriented in accordance with said "easy" axis. The thin magnetic layer which consists of an Ni-Fe compound is manufactured by deposition on a glass substrate and during manufacture it is exposed to a strong homogeneous magnetic d.c. field, which is applied in the plane of the substrate. The orientation of this field determines the so-called "easy" axis, while the axis which is perpendicular thereto is referred to as the "hard" axis, because the layers exhibit a preferred direction of magnetization oriented in accordance with the "easy" axis (uniaxial anisotropy).

German Patent Application P No. 2,605,414 proposes a magnetic field sensor in which a thin magnetic layer, which is magnetized in a preferred direction, is surrounded by a magnetic HF-measuring coil with variable inductance and an external magnetic field and the coil axis are aligned so as to be parallel to one of the preferred directions of magnetization, a magnetic bias field of the order of magnitude of the anisotropic field strength being applied substantially in the direction of the "hard" axis of the magnetic layer and the coil axis being aligned so as to be parallel to the "easy" axis of the layer, so that the inductance of the measuring coil is changed only as a result of variations of components of the magnetic field to be measured in the direction of the "easy" axis.

The sensors consist of one or more thin ferromagnetic layers disposed on a substrate, said layer(s) being surrounded by an "external" coil.

As the layer and coil are physically separated from each other, the transducer is sensitive to external accelerations (forces) and owing to the substrate thickness, which is large in comparison with the magnetic layer, this results in a high air inductance which reduces the sensitivity of the sensor. Furthermore, the manufacturing process of the sensor is complicated and expensive.

It is an object of the invention to provide a thin-layer magnetic field sensor as an integrated element, while avoiding said drawbacks.

In accordance with the invention this is achieved in that the sensor consists of a plurality of geometrically textured layers disposed on a substrate, which constitute a flat coil, of which the insulating layers embed a magnetic layer.

Figure 2:
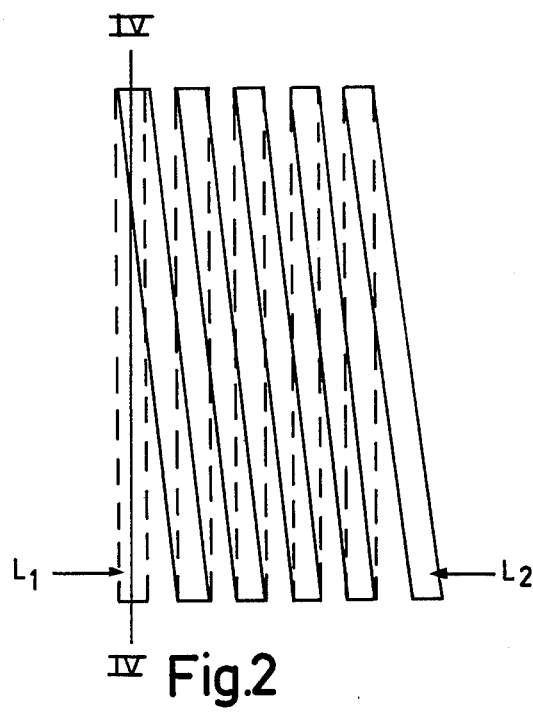

The invention will now be described in greater detail with reference to the accompanying drawing in which:

FIG. 1 shows a sequence of layers for a thin-layer magnetic sensor according to the invention in cross-section, FIG. 2 shows the two electrically conducting layers of the sensor of FIG. 1 which together form a coil, FIG. 3a shows an electrical conductor in cross-section with disadvantageous side profiles, FIG. 3b shows an electrical conductor in cross-section with advantageous side profiles, and FIG. 4 shows a thin-layer magnetic field sensor according to the invention in cross-section.

In a sensor in accordance with FIG. 1 a layer of preferably copper, conductor tracks ($L_1$) having a thickness of a few $\mu$m is first applied on a substrate (S). It may be necessary to fix the copper layer (Cu) to the substrate with the air of a so-called adhering layer H1 (for example of NiCr or Ti of 0.1 $\mu$m thickness). With the aid of a photolithographic process, the Cu layer is textured in such a way that a row of parallel narrow strips is obtained (FIG. 2).

On this texture, as the case may be with an interposed adhering layer $H'_1$, a dielectric layer $D_1$ (for example of $SiO_2$ or an organic polymer) of a thickness of a few $\mu$m is deposited. As the ends of the Cu layer should not be covered with the dielectric, it is advisable to deposit the dielectric layer $D_1$ through a mask. In order to obtain the desired texture of the dielectric layer $D_1$ it is also possible to use a photolithographic process followed by an etching operation.

The magnetic layer M with a thickness ranging from 0.1 $\mu$m to a few $\mu$m is deposited on the dielectric layer $D_1$ by a suitable method, preferably by cathode-sputtering. Deposition is suitably effected through a mask which yields the desired texture on the substrate. Preferably, NiFe (81:19) or MoNiFe (4:79:17) is used as the magnetic material.

Instead of a single magnetic layer it is possible to apply a so-called sandwich comprising a plurality of layers which alternately consist of a magnetic material (preferably of 0.8 $\mu$m thickness) and a dielectric (preferably of 0.3 $\mu$m thickness). Suitably, the complete sandwich is manufactured in a single vacuum-coating process. Application of the magnetic layer(s) is suitably effected in an external magnetic field of 20 to 50 Oersted, in order to impress a preferred direction on the layer ("easy" and "hard" direction respectively, the "easy" direction being preferably parallel to the axis of the coil to be manufactured).

It has been found that vacuum-deposited or sputtered magnetic layers partly lose their favourable magnetic properties when the substrate of the layer is rough or textured.

It is therefore important that the Cu tracks which are disposed underneath the magnetic layer M exhibit no steep edges (FIG. 3a), but are preferably bevelled with the aid of a slope-etching process (FIG. 3b).

On the magnetic layer M a second dielectric layer $D_2$ is deposited whose thickness and texture substantially correspond to the layer $D_1$. The second conductor-track layer $L_2$ is superimposed on the layer $D_2$, as the case may be with an interposed adhering layer $H_2$. This layer $L_2$ preferably also consists of copper. At two ends it contacts the conductor-track layer $L_1$ and is given the form of strips which are situated obliquely relative to the strips of the conductor-track layer $L_1$ in such a way that they constitute a closed flat coil with the strips of the conductor-track layer $L_1$ (FIG. 2), which coil surrounds the magnetic layer. It is essential that the edges of the insulating layers $D_1$ and $D_2$ are not steep but are bevelled so as to ensure satisfactory coverage by the conductor track layer $L_2$, as can be seen in FIG. 4, which shows a cross-section of a sensor which has been manufactured in this way.

The construction of the sensor as a plurality of thin suitably textured layers enables a multitude of sensors to be manufactured in a batch process. In accordance with the batch process a multitude of substrates are simultaneously subjected to one specific manufacturing step, i.e. a multitude of substrates are at the same time subjected to a vacuum-deposition sputtering or etching operation. In general, a series of batch processes enables an element to be manufactured in an inexpensive manner.

What is claimed is:

1. A thin-layer magnetic field sensor in which a thin magnetic layer magnetized in a preferred direction is surrounded by a magnetic HF measuring coil with variable inductance and an external magnetic field and the coil axis are aligned so as to be parallel to a preferred direction of magnetization, the sensor comprising a sequence of superimposed structured layers disposed on a substrate with a first layer of said sequence of layers comprising a structurized metal layer in the form of a row of parallel narrow metal stripes with bevelled sides, a first insulating layer which covers the metal stripes with the exception of the ends of the metal stripes, a magnetic layer covering the first insulating layer, a second insulating layer which completely covers the magnetic layer, and a second structurized metal layer comprising a row of parallel narrow metal stripes with bevelled sides which covers the second insulating layer as well as the ends of the first metal layer.

2. A thin-layer magnetic field sensor as claimed in claim 1 wherein the magnetic layer comprises a plurality of thin magnetic layers separated from each other by insulating layers arranged in a sandwich configuration.

3. A thin-layer magnetic field sensor as claimed in claim 1 or 2 wherein the angle of slope of the bevelled sides of the first row of metal stripes relative to a major surface is $<30°$.

4. A thin-layer magnetic field sensor as claimed in claim 1 or 2 wherein the edge of the insulating layers are bevelled.

5. A thin-layer magnetic field sensor as claimed in claim 1 or 2 wherein the magnetic layer has a preferred direction of magnetization.

6. A thin-layer magnetic field sensor as claimed in claim 1 or 2 wherein the magnetic layer is deposited on the first insulating layer by cathode-sputtering.

7. A thin-film magnetic field sensor comprising, a substrate, a first planar layer comprising a first plurality of thin parallel narrow conductor strips with bevelled edges and superimposed over the substrate, a first thin layer of insulation covering said conductor strips up to but not including a marginal portion at the ends of the conductor strips, a thin magnetic layer covering the first insulation layer and having a preferred direction of magnetization, a second thin layer of insulation covering the magnetic layer, and a second planar layer comprising a second plurality of thin parallel narrow conductor strips superimposed over the second insulation layer and overlapping and in contact with the marginal portion of the first conductor strips so as to form therewith a closed electric path encircling the magnetic layer.

8. A magnetic field sensor as claimed in claim 7 wherein said first and second plurality of conductors form a flat coil having a given axis and wherein the substrate is adapted to be positioned relative to a device for producing an external magnetic bias field so that the external magnetic field and said coil axis are aligned and are parallel to said preferred direction of magnetization.

9. A magnetic field sensor as claimed in claims 7 or 8 wherein said first and second pluralities of parallel conductor strips are located obliquely relative to one another.

10. A magnetic field sensor as claimed in claims 7 or 8 wherein the edges of said first and second insulation layers are bevelled.

11. A thin-layer magnetic field sensor comprising, a substrate having a flat planar surface, a first plurality of thin flat conductor strips with bevelled edges superimposed over the substrate surface so as to form a conductor pattern raised above the surface of the substrate, a first thin layer of insulation covering said conductor strips so as to leave uncovered the ends of the conductor strips, a thin magnetic layer covering the first insulation layer and having a preferred direction of magnetization, a second thin layer of insulation covering the magnetic layer, and a second plurality of thin flat conductor strips superimposed over the second insulation layer and overlapping and in contact with the uncovered ends of the first conductor strips so as to form therewith an electric coil encircling the magnetic layer.

12. A magnetic field sensor as claimed in claim 11 wherein the first plurality of conductor strips are parallel to one another and the second plurality of conductor strips are parallel to one another and said first and second pluralities of conductor strips are arranged obliquely relative to one another.

13. A magnetic field sensor as claimed in claims 11 or 12 wherein the edges of at least said first insulation layer are bevelled.

14. A magnetic field sensor as claimed in claim 11 wherein the first plurality of conductor strips are formed on the substrate surface by means of a photolithographic process that produces conductors having a very low resistance.

* * * * *